(12) United States Patent
Choi et al.

(10) Patent No.: US 9,985,080 B2
(45) Date of Patent: May 29, 2018

(54) ORGANIC LIGHT EMITTING DISPLAY DEVICES AND METHODS OF MANUFACTURING THE SAME

(71) Applicant: SAMSUNG DISPLAY CO., LTD., Yongin, Gyeonggi-Do (KR)

(72) Inventors: Jun-Ho Choi, Yongin-si (KR); Jin-Koo Chung, Suwon-si (KR); Eun-Kyoung Nam, Hwaseong-si (KR); Young-Woo Song, Suwon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days. days.

(21) Appl. No.: 14/620,241

(22) Filed: Feb. 12, 2015

(65) Prior Publication Data
US 2016/0043154 A1 Feb. 11, 2016

(30) Foreign Application Priority Data

Aug. 5, 2014 (KR) ........................ 10-2014-0100667

(51) Int. Cl.
*H01L 27/32* (2006.01)
*H01L 51/56* (2006.01)
*H01L 51/00* (2006.01)

(52) U.S. Cl.
CPC ........ *H01L 27/3258* (2013.01); *H01L 27/326* (2013.01); *H01L 27/3246* (2013.01);
(Continued)

(58) Field of Classification Search
CPC ........... H01L 23/5225; H01L 27/14623; H01L 27/14818; H01L 27/3272;
(Continued)

(56) References Cited

U.S. PATENT DOCUMENTS

| 2003/0142043 A1* | 7/2003 | Matsueda | ............. G02F 1/1341 345/30 |
| 2004/0256980 A1* | 12/2004 | Tsuchiya | ............. H01L 51/5221 313/503 |

(Continued)

FOREIGN PATENT DOCUMENTS

| EP | 2 535 956 A1 | 12/2012 |
| KR | 10-2011-0101777 A | 9/2011 |

(Continued)

OTHER PUBLICATIONS

Claim 2 Chemical Structure, SciFinder®.*
Extended European Search Report dated Jan. 21, 2016 in Corresponding European Patent Application No. 15176895.9.

*Primary Examiner* — Cuong B Nguyen
*Assistant Examiner* — Samuel Park
(74) *Attorney, Agent, or Firm* — Lee & Morse, P.C.

(57) ABSTRACT

An OLED device and a method of manufacturing the same, the OLED device including a substrate having a pixel area and a transmission area; a pixel circuit on the pixel area; a first electrode on the pixel area and being electrically connected to the pixel circuit; a first organic layer extending continuously on the pixel area and the transmission area and covering the first electrode; an emitting layer selectively on a portion of the first organic layer on the pixel area; a second organic layer extending continuously on the pixel and transmission areas and covering the emitting layer; and a third organic layer selectively on the transmission area, the third organic layer including a non-emitting material that has a different transmittance from that of the emitting layer; and a second electrode extending continuously on the pixel area and the transmission area and covering the second and third organic layers.

31 Claims, 13 Drawing Sheets

(52) U.S. Cl.
CPC ...... *H01L 27/3248* (2013.01); *H01L 51/0061* (2013.01); *H01L 51/0072* (2013.01); *H01L 51/56* (2013.01); *H01L 27/3244* (2013.01); *H01L 2227/323* (2013.01)

(58) Field of Classification Search
CPC ..... H01L 2929/78633; H01L 31/02162; H01L 31/02164
See application file for complete search history.

(56) References Cited

U.S. PATENT DOCUMENTS

| | | | |
|---|---|---|---|
| 2005/0067950 A1* | 3/2005 | Nonoue | H01L 51/5284 313/504 |
| 2007/0114521 A1* | 5/2007 | Hayashi | H01L 51/5253 257/40 |
| 2007/0194702 A1 | 8/2007 | Jeng et al. | |
| 2008/0107919 A1* | 5/2008 | Hwang | C07D 209/88 428/691 |
| 2010/0051910 A1* | 3/2010 | Choi | H01L 27/3246 257/40 |
| 2011/0205198 A1 | 8/2011 | Jeong et al. | |
| 2011/0272675 A1 | 11/2011 | Chung et al. | |
| 2012/0012834 A1* | 1/2012 | Sonoda | G02B 5/201 257/40 |
| 2012/0169683 A1 | 7/2012 | Hong | |
| 2012/0267611 A1 | 10/2012 | Chung et al. | |
| 2013/0277649 A1* | 10/2013 | Gregory | H01L 27/3246 257/40 |
| 2013/0313539 A1 | 11/2013 | Ha et al. | |
| 2013/0328022 A1 | 12/2013 | Choi et al. | |
| 2015/0008417 A1* | 1/2015 | Ochi | H01L 51/5281 257/40 |
| 2015/0060823 A1* | 3/2015 | Furuie | H01L 27/3223 257/40 |
| 2015/0155516 A1* | 6/2015 | Yamashita | H01L 51/5056 257/40 |

FOREIGN PATENT DOCUMENTS

| | | |
|---|---|---|
| KR | 10-2011-0122513 A | 11/2011 |
| KR | 10-2012-0079318 A | 7/2012 |
| KR | 10-2013-0138883 A | 12/2013 |

* cited by examiner ns area; and a second capping layer on the first capping layer, the second capping layer being selectively disposed on either the pixel area or the transmission area.

The OLED device may further include a via insulation layer covering the pixel circuit; and a pixel defining layer on the via insulation layer, the first electrode being exposed through the pixel defining layer, wherein the first electrode extends through the via insulation layer to be electrically connected to the pixel circuit.

The transmission area may be at least partially exposed by the pixel defining layer, and a transmitting window may be defined by a sidewall of the pixel defining layer.

The pixel defining layer may include a black material.

The black material may include at least one of carbon black, phenylene black, aniline black, cyanine black, and nigrosine acid black.

A top surface of the via insulation layer may be exposed by the transmitting window, and the first organic layer may extend continuously on surfaces of the pixel defining layer and the first electrode, and on the top surface of the via insulation layer.

The transmitting window may be defined by the sidewall of the pixel defining layer and a sidewall of the via insulation layer.

The OLED device may further include an insulating interlayer under the via insulation layer, the insulating interlayer partially covering the pixel circuit, wherein the first organic layer extends continuously on surfaces of the pixel defining layer and the first electrode, the sidewall of the via insulation layer, and a top surface of the insulating interlayer.

The embodiments may be realized by providing an organic light emitting display (OLED) device including a substrate, the substrate including a pixel area and a transmission area; a first electrode selectively on the pixel area of the substrate; a common organic layer extending continuously on the pixel area and the transmission area and covering the first electrode; an emitting layer selectively on the pixel area; a non-pixel organic layer selectively on the transmission area; and a second electrode extending continuously on the pixel area and the transmission area, the second electrode facing the first electrode with respect to the common organic layer.

The non-pixel organic layer may have a transmittance that is higher than that of the emitting layer.

The non-pixel organic layer may be on the common organic layer and in contact with the second electrode.

The common organic layer may include a first organic layer between the first electrode and the emitting layer, and a second organic layer between the emitting layer and the second electrode, and the non-pixel organic layer may be between the first organic layer and the second organic layer.

The first organic layer may include a hole transport material, and the second organic layer may include an electron transport material.

The embodiments may be realized by providing an organic light emitting display (OLED) device including a substrate, the substrate including a pixel area and a transmission area; a pixel circuit on the pixel area of the substrate; a first electrode on the pixel area of the substrate, the first electrode being electrically connected to the pixel circuit; a hole transport layer extending continuously on the pixel area and the transmission area of the substrate and covering the first electrode; an emitting layer selectively on a portion of the hole transport layer on the pixel area; a transmittance control layer on a portion of the hole transport layer on the transmission area; and a second electrode

ORGANIC LIGHT EMITTING DISPLAY DEVICES AND METHODS OF MANUFACTURING THE SAME

CROSS-REFERENCE TO RELATED APPLICATION

Korean Patent Application No. 10-2014-0100667, filed on Aug. 5, 2014, in the Korean Intellectual Property Office, and entitled: "Organic Light Emitting Display Devices and Methods of Manufacturing the Same," is incorporated by reference herein in its entirety.

BACKGROUND

1. Field

Embodiments relate to organic light emitting display devices and methods of manufacturing the same.

2. Description of the Related Art

An organic light emitting display (OLED) device is a self-emitting display device that may be operated with a low voltage, and have a wide viewing angle and an improved contrast property.

SUMMARY

Embodiments are directed to organic light emitting display devices and methods of manufacturing the same.

The embodiments may be realized by providing an organic light emitting display (OLED) device, including a substrate, the substrate including a pixel area and a transmission area; a pixel circuit on the pixel area of the substrate; a first electrode on the pixel area of the substrate, the first electrode being electrically connected to the pixel circuit; a first organic layer extending continuously on the pixel area and the transmission area of the substrate and covering the first electrode; an emitting layer selectively on a portion of the first organic layer on the pixel area; a second organic layer extending continuously on the pixel area and the transmission area of the substrate and covering the emitting layer; and a third organic layer selectively on the transmission area, the third organic layer including a non-emitting material that has a different transmittance from that of the emitting layer; and a second electrode extending continuously on the pixel area and the transmission area of the substrate and covering the second organic layer and the third organic layer.

The third organic layer may include at least one of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H-fluorene-2-amine, and 2-(4-(9,10-di(naphthalen-2-yl)anthracen-2-yl)phenyl)-1-phenyl-1H-benzo-[D]imidazole.

The first organic layer may include a hole transport material, and the second organic layer may include an electron transport material.

The third organic layer may be between the first organic layer and the second organic layer.

The third organic layer may be between the second organic layer and the second electrode.

The emitting layer and the third organic layer may be spaced apart from each other at an interface between the pixel area and the transmission area.

The OLED device may further include a capping layer on the second electrode.

The capping layer may include a first capping layer extending continuously on the pixel area and the transmisextending continuously on the pixel area and the transmission area of the substrate, the second electrode covering the emitting layer and the transmittance control layer.

The OLED device may further include an electron transport layer between the emitting layer and the second electrode, the electron transport layer extending continuously on the pixel area and the transmission area of the substrate.

The embodiments may be realized by providing a method of manufacturing an organic light emitting display device, the method including preparing a substrate that includes a pixel area and a transmission area; forming a pixel circuit on the pixel area of the substrate; forming a first electrode that is electrically connected to the pixel circuit on the pixel area of the substrate; forming a hole transport layer on the pixel area and the transmission area using an open mask such that the hole transport layer covers the first electrode; forming an emitting layer on the hole transport layer using a first mask, the first mask including a first opening through which the pixel area is selectively exposed; forming a transmittance control layer on the hole transport layer using a second mask, the second mask including a second opening through which the transmission area is selectively exposed; and forming a second electrode continuously on the emitting layer and the transmittance control layer using the open mask.

The transmittance control layer may include a non-emitting material that is different from a material included in the emitting layer.

The method may further include forming an electron transport layer on the pixel area and the transmission area using the open mask such that the electron transport layer is between the emitting layer and the second electrode.

The method may further include forming a first capping layer on the second electrode using the open mask.

The method may further include forming a second capping layer on the first capping layer using the first mask or the second mask such that the second capping layer is selectively formed on either of the pixel area or the transmission area.

The method may further include forming a via insulation layer that covers the pixel circuit; forming a pixel defining layer on the via insulation layer such that the first electrode is exposed through the pixel defining layer; and removing a portion of the pixel defining layer on the transmission area to form a transmitting window, wherein the second mask is used as an etching mask in the removing the portion of the pixel defining layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
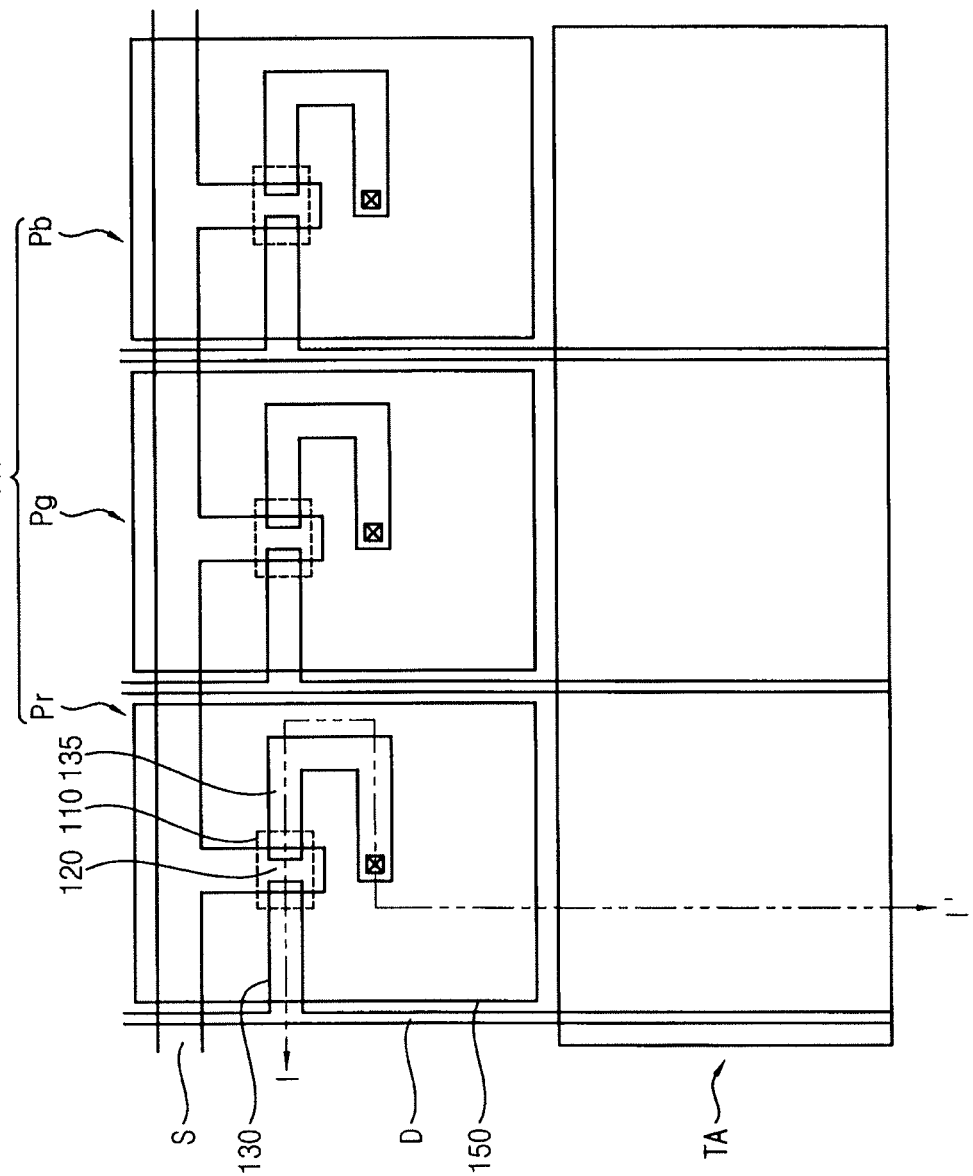
FIG. 1 illustrates a schematic top plan view of an organic light emitting display (OLED) device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
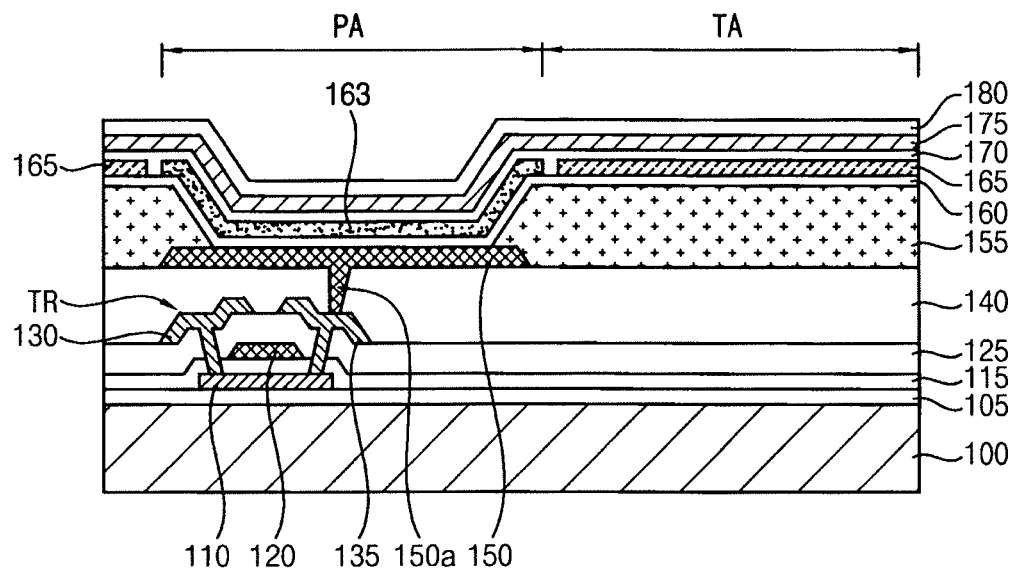
FIG. 2 illustrates a cross-sectional view of an OLED device in accordance with some embodiments.

FIG. 1 illustrates a schematic top plan view of an organic light emitting display (OLED) device in accordance with some embodiments. FIG. 2 illustrates a cross-sectional view of an OLED device in accordance with some embodiments. For example, FIG. 2 is a cross-sectional view taken along a line I-I' of FIG. 1

Referring to FIGS. 1 and 2, the OLED device may include a pixel area PA and a transmission area TA.

The pixel area PA may include a red pixel Pr, a green pixel Pg, and a blue pixel Pb, which may be adjacent to each other. The transmission area TA may be adjacent to the pixel area PA. As illustrated in FIG. 1, the transmission area TA may continuously extend to be adjacent to the red pixel Pr, the green pixel Pg, and the blue pixel Pb. In an implementation, the transmission area TA may be individually patterned for each pixel.

In example embodiments, a light emitting structure may be disposed on the pixel area PA to generate an image. An external light may be transmitted through the transmission area TA so that an external image may be observed therethorugh.

A transistor TR (e.g., a thin film transistor) may be disposed in each pixel, and the transistor TR may be electrically connected to a data line D and a scan line S. As illustrated in FIG. 1, the data line D and the scan line S may cross each other, and the each pixel may be defined at an intersection region of the data line D and the scan line S. A pixel circuit may be defined by the data line D, the scan line S and the transistor TR. The pixel circuit may further include a power line (Vdd, not illustrated) that may be parallel to the date line D. Additionally, a capacitor electrically connected to the power line and the transistor TR may be disposed in each pixel.

As illustrated in FIG. 2, the OLED device may include the transistor TR on a substrate 100, a via insulation layer 140 covering the transistor TR, the light emitting structure electrically connected to the transistor TR and disposed on the via insulation layer 140 of the pixel area PA, and a transmittance control layer (TCL) 165 on the transmission area TA.

The substrate 100 may include a transparent insulation substrate. For example, a glass substrate, a transparent plastic substrate including polyethylene terephthalate (PET), polyethylene naphthalate (PEN), or polyimide, or a transparent metal oxide substrate may be used as the substrate 100. The substrate 100 may be divided into the pixel area PA and the transmission area TA. For example, the pixel area PA of the substrate 100 may correspond to or be aligned with the pixel area PA of the prepared OLED, and the transmission area TA of the substrate 100 may correspond to or be aligned with the transmission area TA of the prepared OLED.

A buffer layer 105 may be formed on the substrate 100 to cover a top surface of the substrate 100. The buffer layer 105 may help prevent impurities from being diffused between the substrate 100 and structures thereon. In addition, flatness or planarity of the substrate 100 may be improved by the buffer layer 105.

In an implementation, the buffer layer 105 may include silicon oxide, silicon nitride, or silicon oxynitride. These may be used alone or in a combination thereof. In an implementation, the buffer layer 105 may have a multi-layered structure including a silicon oxide layer and a silicon nitride layer. In an implementation, the buffer layer 105 may include a transparent organic material such as polyimide, polyester, an acryl-based compound, etc.

An active layer 110 may be disposed on the buffer layer 105. The active layer 110 may include an oxide semiconductor. For example, the active layer 110 may include indium gallium zinc oxide (IGZO), zinc tin oxide (ZTO), or indium tin zinc oxide (ITZO).

In an implementation, the, the active layer 110 may include polysilicon or amorphous silicon. In this case, impurities may be implanted at both end portions of the active layer 110 to form a source region and a drain region. A portion of the active layer 110 between the source region and the drain region may be defined as a channel region through which charges are moved or transferred.

A gate insulation layer 115 may be formed on the buffer layer 105 to cover the active layer 110. The gate insulation layer 115 may include silicon oxide, silicon nitride, or silicon oxynitride. These may be used alone or in a combination thereof. The gate insulation layer 115 may have a multi-layered structure including a silicon oxide layer and a silicon nitride layer.

A gate electrode 120 may be disposed on the gate insulation layer 115. The gate electrode 120 may include a metal, an alloy, or a metal nitride. For example, the gate electrode 120 may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd), and scandium (Sc), an alloy thereof, or a nitride thereof. These may be used alone or in a combination thereof. The gate electrode 120 may include at least two metal layers having different physical properties. For example, the gate electrode 120 may have a double-layered structure such as an Al/Mo structure or a Ti/Cu structure.

The gate electrode 120 may be superimposed over or may overlie the active layer 110. The gate electrode 120 may be electrically connected to the scan line S. For example, the gate electrode 120 may be diverged from the scan line S.

An insulating interlayer 125 may be formed on the gate insulation layer 115 to cover the gate electrode 120. The insulating interlayer 125 may include silicon oxide, silicon nitride, or silicon oxynitride. These may be used alone or in a combination thereof. The gate insulating interlayer 125 may have a multi-layered structure including a silicon oxide layer and a silicon nitride layer.

A source electrode 130 and a drain electrode 135 may extend through the insulating interlayer 125 and the gate insulation layer 115 to be in contact with the active layer 110. The source electrode 130 and the drain electrode 135 may include a metal such as Al, Ag, W, Cu, Ni, Cr, Mo, Ti, Pt, Ta, Nd, or Sc, an alloy thereof, or a nitride thereof. These may be used alone or in a combination thereof. The source electrode 130 and the drain electrode 135 may include at least two different metal layers.

If the active layer 110 includes polysilicon or amorphous silicon, the source electrode 130 and the drain electrode 135 may be in contact with the source region and the drain region of the active layer 110, respectively.

The source electrode 130 may be electrically connected to the data line D. For example, the source electrode 130 may be diverged from the data line D.

The transistor TR may be defined by the active layer 110, the gate insulation layer 115, the gate electrode 120, the source electrode 130, and the drain electrode 135.

FIG. 2 illustrates that one transistor TR is included in each pixel, however, a plurality of the transistors TR may be included in the each pixel. For example, a switching transistor and a driving transistor may be included in the each pixel. A capacitor may be further included in the each pixel.

FIG. 2 illustrates that the transistor TR has a top-gate structure in which the gate electrode 120 is disposed over the active layer 110. However, the transistor TR may have a bottom-gate structure in which the gate electrode is disposed under the active layer.

The via insulation layer 140 may be formed on the insulating interlayer 125, and may cover the source electrode 130 and the drain electrode 135. A via structure electrically connecting a first electrode 150 and the drain electrode 135 may be accommodated in the via insulation layer 140. The via insulation layer 140 may have a substantially planar or level top surface.

In an implementation, the via insulation layer 140 may include a transparent organic material, e.g., polyimide, an epoxy-based resin, an acryl-based resin, polyester, or the like.

The light emitting structure may be disposed on a portion of the via insulation layer 140 on the pixel area PA. The light emitting structure may include the first electrode 150, a hole transport layer 160 (HTL), an emitting layer 163, an electron transport layer 170 (ETL), and a second electrode 175, which may be sequentially stacked on the via insulation layer 140.

The first electrode 150 may be disposed on the via insulation layer 140. The first electrode 150 may include a via portion 150a extending through the via insulation layer 140 to be electrically connected to the drain electrode 135.

In an implementation, the first electrode 150 may serve as a pixel electrode and may be formed on each pixel area PA. The first electrode 150 may also serve as an anode of the OLED device.

In an implementation, the first electrode 150 may be a reflective electrode. In this case, the first electrode 150 may include a metal, e.g., Al, Ag, W, Cu, Ni, Cr, Mo, Ti, Pt, Ta, Nd or Sc, or an alloy thereof. The OLED device may be a top emission type generating an image toward the second electrode 175.

In an implementation, the first electrode 150 may include a transparent conductive material having a high work function. For example, the first electrode 150 may include indium tin oxide (ITO), indium zinc oxide (IZO), zinc oxide, or indium oxide.

A pixel defining layer 155 (PDL) may be formed on the via insulation layer 140. The PDL 155 may cover a peripheral portion of the first electrode 150. The PDL 155 may include, e.g., a transparent organic material such as a polyimide-based resin or an acryl-based resin. An area of the first electrode 150 that is not covered by the PDL 155 may be substantially equal to an area of an emission region in the each pixel.

The HTL 160 may be formed conformably on surfaces of the PDL 155 and the first electrode 150. In an implementation, the HTL 160 may be provided continuously and commonly on the pixel area PA and the transmission area TA.

The HTL 160 may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The emitting layer 163 and the TCL 165 may be formed on the HTL 160. In an implementation, the emitting layer 163 and the TCL 165 may be disposed on the pixel area PA and the transmission area TA, respectively. For example, the emitting layer 163 may overlie the pixel area PA of the substrate 100 and the TCL 165 may overlie the transmission area TA of the substrate 100.

The emitting layer 163 may be patterned individually on the each pixel. For example, the emitting layer 163 may be provided individually on the red pixel Pr, the green pixel Pg, and the blue pixel Pb, and may include light emitting materials for generating different colors of light, e.g., a red color of light, a green color of light, or a blue color of light. The light emitting material may include a host material excited by holes and electrons, and a dopant material for facilitating an absorbance and a release of energy and improving a light emitting efficiency.

The host material may include, e.g., tris(8-quinolinolato)aluminum (Alq3), a derivative of Alq3,4,4'-bis(2,2-diphenyl-ethene-1-yl)-4,4'-dimethylphenyl (DPVBi), 1,3-bis(carbazol-9-yl)benzene (mCP), or 4,4'-bis(carbazol-9-yl) biphenyl (CBP).

The dopant material may include, e.g., a fused aromatic cyclic compound such as rubrene.

The TCL 165 may include, e.g., a transparent organic material for optimizing a transmittance in the transmission area TA. In an implementation, the TCL 165 may include an organic material having a refractive index that is substantially the same as or similar to those of the HTL 160 and the ETL 170 and that does not exhibit a light emitting property. For example, the TCL 165 may include a non-emitting material that is different from the light emitting material of the emitting layer 163. In an implementation, the TCL 165 may have a transmittance greater than that of the emitting layer 163.

In an implementation, the flatness or planarity in the transmission area TA may be enhanced by the TCL 165.

For example, the TCL 165 may include N,N'-diphenyl-N,N-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H-fluorene-2-amine, or 2-(4-(9,10-di (naphthalen-2-yl)anthracen-2-yl)phenyl)-1-phenyl-1H-benzo-[D]imidazole.

In an implementation, the TCL 165 and the emitting layer 163 may be spaced apart from each other by a predetermined distance. For example, the TCL 165 and the emitting layer 163 may be spaced apart from each other along an extending direction of the data line D. For example, the TCL 165 may be spaced apart from the emitting layer 163 at an interface between the pixel area PA and the transmission area TA. Accordingly, the TCL 165 and the emitting layer 163 may not contact or overlap each other. Thus, a light emitting property in the pixel area PA may not be affected or disturbed by the TCL 165 so that a transmittance property in the transmission region TA may be selectively optimized.

In an implementation, end portions of the TCL 165 and the emitting layer 163 may partially overlap each other.

The ETL 170 may be formed on the HTL 160 and may cover the emitting layer 163 and the TCL 165. In an implementation, the ETL 170 may be formed continuously and commonly on the pixel area PA and the transmission area TA.

In an implementation, the ETL 170 may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenyl-phenolato-aluminum (BAlq), bathocuproine (BCP), triazole (TAZ), phenylquinozaline, or a combination thereof.

In an implementation, the TCL 165 may be sandwiched or interposed between the HTL 160 and the ETL 170 on the transmission region TA.

The second electrode 175 may be disposed on the ETL 170. In an implementation, the second electrode 175 may be commonly provided on the pixels included in the pixel area PA to serve as a common electrode of the OLED device. The second electrode 175 may extend continuously and commonly on the pixel area PA and the transmission area TA.

The second electrode 175 may include, e.g., a metal such as Al, Ag, W, Cu, Ni, Cr, Mo, Ti, Pt, Ta, Nd, or Sc, or an alloy thereof. The second electrode 175 may have a thin thickness relative to the first electrode 150, e.g., the second electrode 175 may be thinner than the first electrode 150, to help improve a transparency or a transmittance of the OLED device. For example, the second electrode 175 may have a thickness of about 100 Å to about 300 Å.

In an implementation, the second electrode 175 may have a uniform thickness throughout the pixel area PA and the transmittance area TA.

In an implementation, a hole injection layer (HIL) may be further formed between the HTL 160 and the first electrode 150. An electron injection layer (EIL) may be further formed between the ETL 170 and the second electrode 175. The HIL and the EIL may be provided commonly and continuously on the pixel area PA and the transmission area TA.

The HIL may include, e.g., (N-carbazolyl)triphenylamine (TCTA) or 4,4',4"-tris[3-methylphenyl (phenyl)amino]triphenylamine (m-MTDATA). The EIL may include, e.g., lithium fluoride (LiF) or cesium fluoride (CsF).

A capping layer 180 may be formed on the second electrode 175 so that the light emitting structure and the transmission area TA may be protected by the capping layer 180. In an implementation, the capping layer 180 may include, e.g., a transparent organic material, such as polyimide, an epoxy-based resin, an acryl-based resin, polyester, or the like. In an implementation, the capping layer 180 may include, e.g., an inorganic material such as silicon oxide, silicon nitride, or silicon oxynitride.

In an implementation, the capping layer 180 may be provided continuously and commonly on the pixel area PA and the transmission area TA.

According to example embodiments, different layer stack structures may be formed on the pixel area PA and the transmission area TA. For example, as illustrated in FIG. 2, a layer stack structure including the first electrode 150, the HTL 160, the emitting layer 163, the ETL 170, and the second electrode 175 may be formed on the pixel area PA. A layer structure including the PDL 155, the HTL 160, the TCL 165, the ETL 170, and the second electrode 175 may be formed on the transmission area TA.

Therefore, a resonance structure for optimizing a light emitting efficiency may be realized on the pixel area PA, and the layer stack structure for optimizing a transmittance may be realized on the transmission area TA.

According to example embodiments, the HTL 160, the ETL 170 and the second electrode 175 may be provided commonly and uniformly on the pixel area PA and the transmission area TA. For example, the HTL 160, the ETL 170 and the second electrode 175 may have substantially uniform thicknesses and compositions throughout the pixel area PA and the transmission area TA. The transmittance or the transparency of the transmission area TA may be selectively optimized by the TCL 165, so that a desired transmittance of the OLED device may be achieved without transforming or disturbing an optical resonance structure of the HTL 160, the ETL 170 and the second electrode 175.

In an implementation, an encapsulation substrate may be further disposed on the second electrode 175 or the capping layer 180 to face the substrate 100. The encapsulation substrate may include a transparent material substantially the same as or similar to that of the substrate 100. In an implementation, the OLED device may further include a spacer connecting the substrate 100 and the encapsulation substrate, and a filler including, e.g., a moisture absorbent, may be filled in a space between the substrate 100 and the encapsulation substrate.

Figure 3:
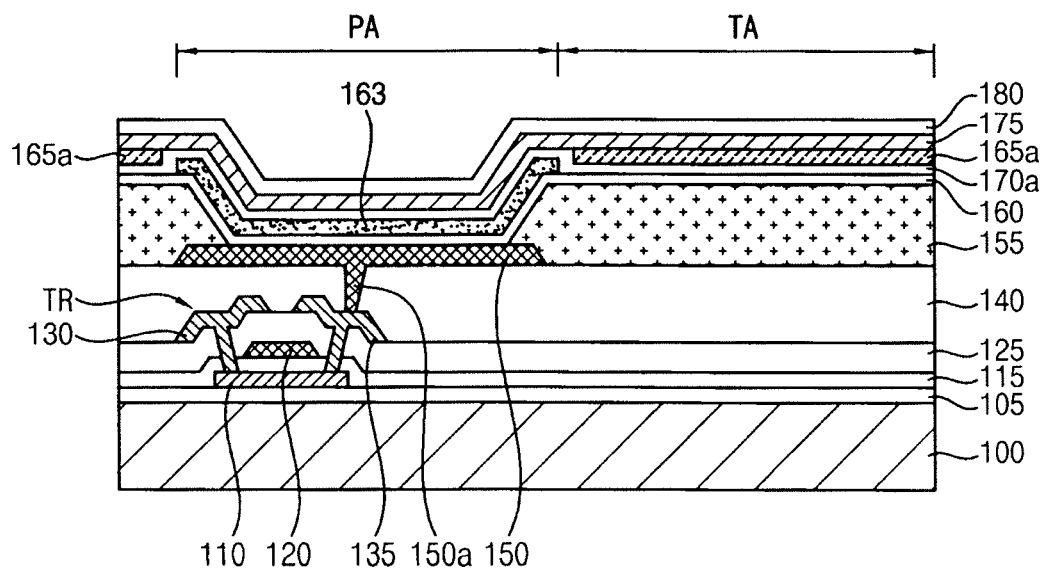
FIG. 3 illustrates a cross-sectional view of an OLED device in accordance with some embodiments.

FIG. 3 illustrates a cross-sectional view of an OLED device in accordance with some embodiments. For example, FIG. 3 illustrates cross-sectional view taken along a line I-I' of FIG. 1. The OLED device of FIG. 3 may have elements and/or constructions substantially the same as or similar to those of the OLED device illustrated in FIG. 2, except for an arrangement of the TCL. Thus, repeated detailed descriptions of elements and/or structures may be omitted herein, and like reference numerals are used to indicate like reference elements.

Referring to FIG. 3, and as also illustrated in FIG. 2, a layer stack structure including a first electrode 150, an HTL 160, an emitting layer 163, an ETL 170a, and a second electrode 175 may be defined on a pixel area PA of the OLED device. A layer structure including a PDL 155, the HTL 160, the ETL 170a, a TCL 165a, and the second electrode 175 may be defined on a transmission area TA of the OLED device.

The ETL 170a may cover the ETL 163 on the pixel area PA, and may be formed on the HTL 160 on the transmission area TA. The ETL 170a and the HTL 160 may serve as common layers continuously formed on the pixel area PA and the transmission area TA.

In an implementation, the TCL 165a may be disposed on a portion of the HTL 170a on the transmission area TA. As illustrated in FIG. 3, the TCL 165a and the emitting layer 163 may be spaced apart or separated from each other, e.g., by (a portion of) the ETL 170a.

In an implementation, the TCL 165a may be in contact with the second electrode 175. In an implementation, an additional common layer, e.g., an EIL may be interposed between the TCL 165a and the second electrode 175.

Figure 4:
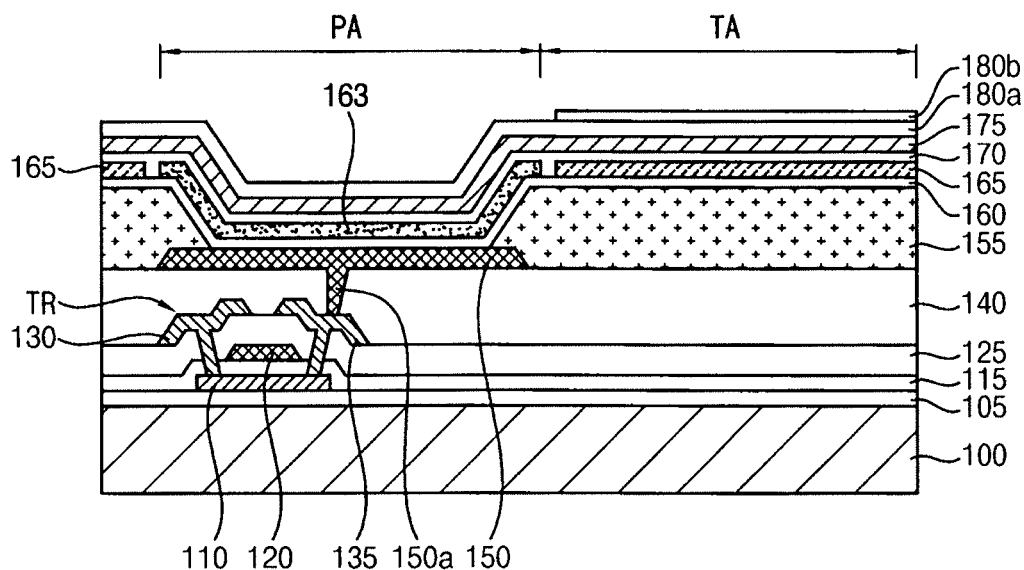
FIGS. 4 and 5 illustrate cross-sectional views of OLED devices in accordance with some embodiments.
Figure 5:
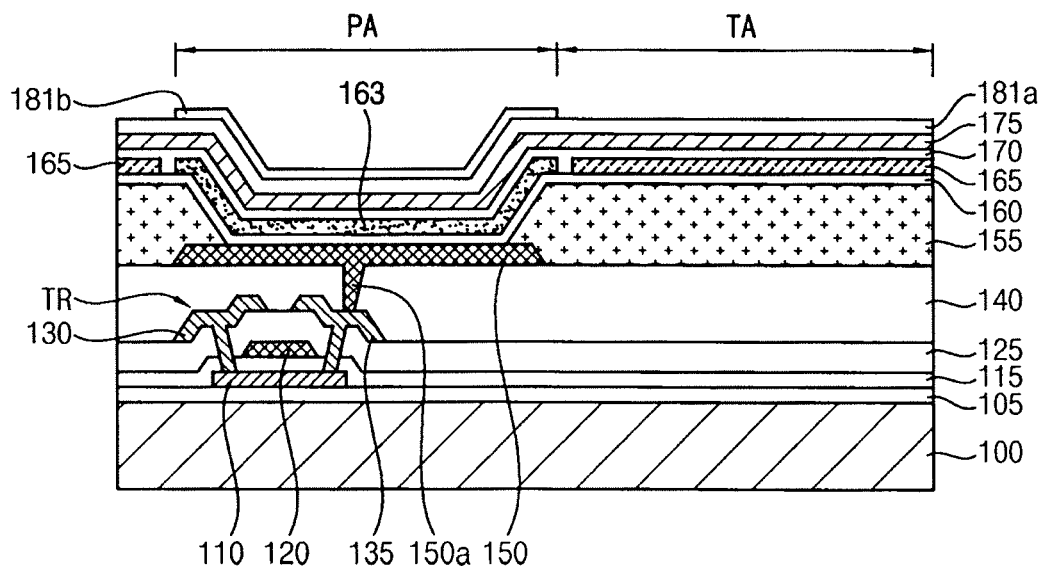

FIGS. 4 and 5 illustrate cross-sectional views of OLED devices in accordance with some embodiments. For example, FIGS. 4 and 5 illustrate cross-sectional views taken along a line I-I' of FIG. 1. The OLED devices of FIGS. 4 and 5 may have elements and/or constructions substantially the same as or similar to those of the OLED device illustrated in FIG. 2, except for a structure of a capping layer. Thus, repeated detailed descriptions of some elements and/or structures may be omitted herein, and like reference numerals are used to indicate like reference elements.

Referring to FIG. 4, and as also illustrated in FIG. 2, a layer stack structure including a first electrode 150, an HTL 160, an emitting layer 163, an ETL 170, and a second electrode 175 may be defined on a pixel area PA of the OLED device. A layer structure including a PDL 155, the HTL 160, a TCL 165, the ETL 170, and the second electrode 175 may be defined on a transmission area TA of the OLED device.

A capping layer may be disposed on the second electrode 175. The capping layer may include a first capping layer 180a and a second capping layer 180b.

The first capping layer 180a may be provided continuously and commonly on the pixel area PA and the transmission area TA. In an implementation, the first capping layer 180a may include a transparent organic material, e.g., a polyimide-based resin, an epoxy-based resin, or an acryl-based resin.

The second capping layer 180b may be disposed on the first capping layer 180a. The second capping layer 180b may be formed selectively on the transmission area TA. For example, the second capping layer 180b may be formed only on the transmission area TA, and not on the pixel area PA.

In an implementation, the second capping layer 180b may have a sectional size from a top or plan view that is substantially the same as that of the TCL 165. Thus, the second capping layer 180b and the TCL 165 may cover substantially the same area of the OLED device.

In an implementation, the second capping layer 180b may include a material substantially the same as or similar to that of the TCL 165. For example, the TCL 165 (and the second capping layer 180b) may include an organic material such as N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, or 2-(4-(9,10-di(naphthalen-2-yl)anthracen-2-yl)phenyl)-1-phenyl-1H-benzo-[D]imidazole.

In an implementation, the second capping layer 180b may have a thickness that is smaller than that of the first capping layer 180a.

According to example embodiments described above, the second capping layer 180b (selectively covering, e.g., only, the transmission area TA) may be formed on the first capping layer 180a. Therefore, a transmittance optimizing structure may be achieved without disturbing a light emitting property on the pixel area PA.

Referring to FIG. 5, a second capping layer 181b may be selectively formed on the pixel area PA. For example, the second capping layer 181b may be formed only on pixel area PA, and not on the transmission area TA. The second capping layer 181b may extend in a direction of the scan line S illustrated in FIG. 1, and may be provided commonly on a plurality of the emitting layers 163.

In this case, a first capping layer 181a may include a material for optimizing a transmittance on the transmission area TA. For example, the first capping layer 181a may include a material substantially the same as or similar to that of the TCL 165.

The second capping layer 181b may include a material for protecting the pixel area PA and for improving a light emitting efficiency thereof. In an implementation, the second capping layer 181b may include a transparent organic material, e.g., a polyimide-based resin, an epoxy-based resin, or an acryl-based resin.

Figure 6:
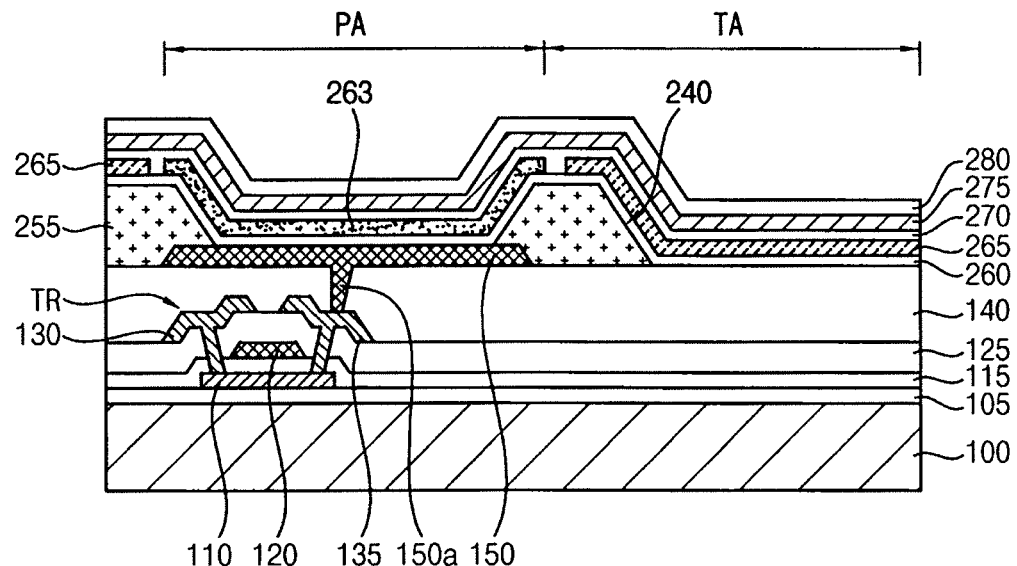
FIGS. 6 and 7 illustrate cross-sectional views of OLED devices in accordance with some embodiments.
Figure 7:
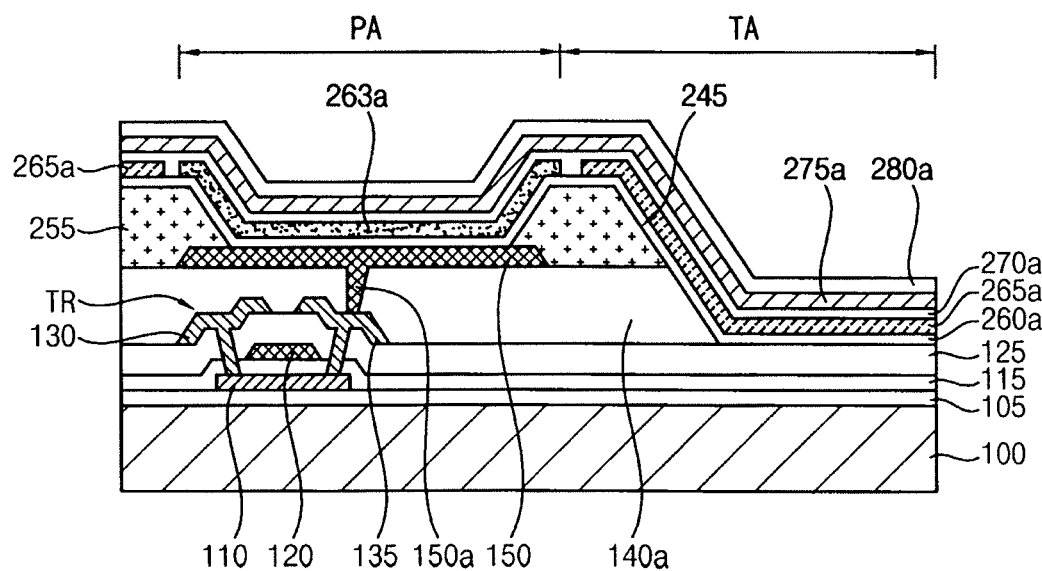

FIGS. 6 and 7 illustrate cross-sectional views of OLED devices in accordance with some embodiments. For example, FIGS. 6 and 7 illustrate cross-sectional views taken along a line I-I' of FIG. 1. Repeated detailed descriptions on elements and/or constructions that are substantially the same as or similar to those illustrated with reference to FIG. 1 may be omitted.

Referring to FIG. 6, a transmitting window 240 may be defined on a transmission area TA for improving a transmittance. In an implementation, the transmitting window 240 may be defined by sidewalls of PDLs 255 adjacent to each other. In an implementation, a top surface of the via insulation layer 140 may be exposed through the transmitting window 240.

In this case, the PDL 255 may include a plurality of line patterns or grid patterns, and may be at a boundary between pixel and transmission areas PA and TA.

In an implementation, the PDL 255 may include a black material. For example, the PDL 255 may include carbon black, phenylene black, aniline black, cyanine black, nigrosine acid black, or the like. The PDL 255 may include the above-mentioned black material so that interference of lights from the pixel and transmission areas PA and TA, or from adjacent pixels may be avoided.

In an implementation, the PDL 255 may include a transparent organic material, e.g., a polyimide-based resin or an acryl-based resin as described with reference to FIG. 2.

An HTL 260 may be formed conformably (or conformally) and continuously along or on surfaces of the PDL 255 and a first electrode 150, and the top surface of the via insulation layer 140 that is exposed through the transmitting window 240. In an implementation, the HTL 260 may be continuously and commonly provided on the pixel and transmission areas PA and TA.

An emitting layer 263 and a TCL 265 may be formed on the pixel area PA and the transmission area TA, respectively.

In an implementation, as illustrated in FIG. 6, the emitting layer 263 and the TCL 265 may extend onto a top surface of the PDL 255, and may be spaced apart from each other on the top surface of the PDL 255.

In an implementation, the emitting layer 263 and the TCL 265 may not extend onto the top surface of the PDL 255. In this case, the emitting layer 263 and the TCL 265 may be confined by or end at the sidewalls of the PDL 255.

An ETL 270, a second electrode 275, and a capping layer 280 may be sequentially stacked on the emitting layer 263 and the TCL 265, and may be provided commonly on the pixel area PA and the transmission area TA.

Referring to FIG. 7, a transmitting window may be defined by sidewalls of the PDL 255 and sidewalls of a via insulation layer 140a. In this case, the transmitting window 245 may be formed through the PDL 255 and the via insulation layer 140a, and a top surface of the insulating interlayer 125 may be exposed through the transmitting window 245. The sidewalls of the PDL 255 and the via insulation layer 140a may extend on substantially the same plane.

An HTL 260a may be formed conformably and continuously on surfaces of the PDL 255 and the first electrode 150, and on the top surface of the insulating interlayer 125 that is exposed through the transmitting window 245.

An emitting layer 263a and a TCL 265a may be disposed selectively on portions of the HTL 260a of the pixel area PA and the transmission area TA, respectively. For example, the emitting layer 263a may be disposed only on the pixel area PA and the TCL 265a may be disposed only on the transmission are TA. An ETL 270a, a second electrode 275a, and a capping layer 280a may be sequentially stacked on the emitting layer 263a and the TCL 265a, and may be provided commonly on the pixel and transmission areas PA and TA.

In an implementation, the transmitting window may be defined by sidewalls of the PDL 255, sidewalls of the via insulation layer 140a, and sidewalls of the insulating interlayer 125. In this case, a top surface of a gate insulation layer 115 may be exposed through the transmission window. In an implementation, the transmitting window may be defined by sidewalls of the PDL 255, sidewalls of the via insulation layer 140a, sidewalls of the insulating interlayer 125, and sidewalls of the gate insulation layer 115. In this case, a top surface of a buffer layer 105 may be exposed through the transmitting window.

In an implementation, a portion of the buffer layer 105 in the transmission area TA may be also removed to expand the transmitting window, and a portion of the buffer layer 105 may remain to help prevent an impurity diffusion.

As described above, the transmitting window 240 and 245 may be formed on the transmission area TA to help further improve a transmittance thereof.

In an implementation, as described with reference to FIG. 5, the TCL 265 and 265a may be disposed on the ETL 270 and 270b serving as common layers with the HTL 260 and 260a.

In an implementation, as described with reference to FIGS. 4 and 5, the capping layer 280 and 280a may include a first capping layer and a second capping layer. The second capping layer may be selectively disposed on the pixel area PA or the transmittance area TA.

Figure 8:
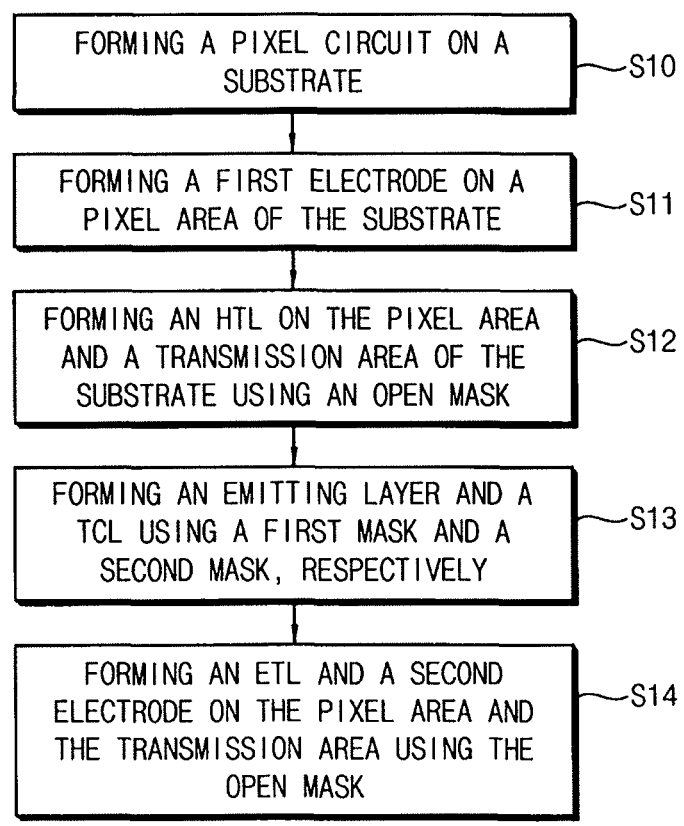
FIG. 8 illustrates a flow chart of a method of manufacturing an OLED device in accordance with some embodiments.

FIG. 8 illustrates a flow chart of a method of manufacturing an OLED device in accordance with an embodiment. FIGS. 9 to 13 illustrate cross-sectional views of stages in a method of manufacturing an OLED device in accordance with an embodiment.

Figure 9:
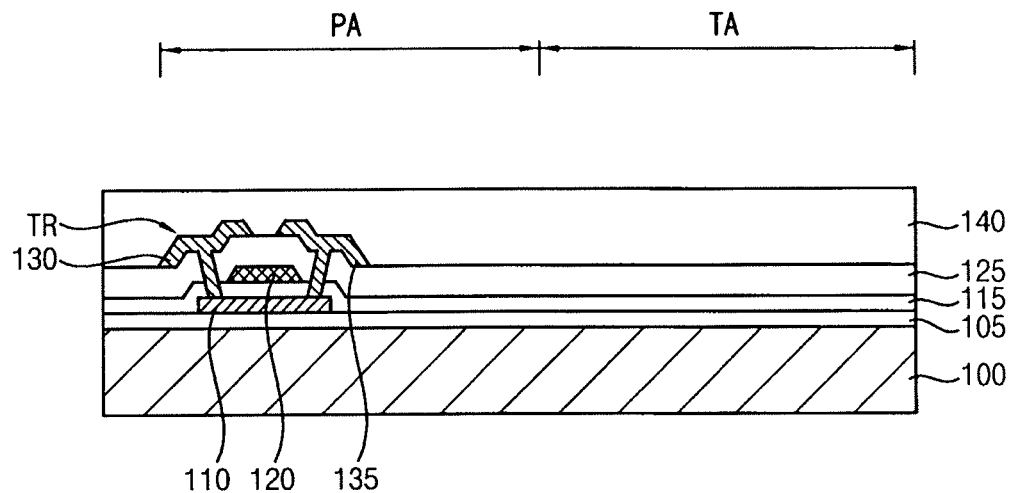
FIGS. 9 to 13 illustrate cross-sectional views of stages in a method of manufacturing an OLED device in accordance with some embodiments.

Referring to FIGS. 8 and 9, in operation S10, a pixel circuit may be formed on a substrate 100.

In an implementation, a glass substrate or a transparent insulation substrate such as a transparent plastic substrate may be used as the substrate 100. The substrate 100 may be divided into a pixel area PA and a transmission area TA, e.g., to ultimately form an OLED having a pixel area PA and a transmission area TA.

A buffer layer 105 may be formed on the substrate 100. The buffer layer 105 may be formed using silicon oxide, silicon nitride, or silicon oxynitride. The buffer layer 105 may be formed on a substantially whole top surface of the substrate 100

An active layer 110 may be formed on the buffer layer 105. For example, a semiconductor material layer may be formed on the buffer layer 105, and then the semiconductor layer may be patterned by, e.g., a photolithography process, to form the active layer 110.

The semiconductor material layer may be formed using an oxide semiconductor, e.g., IGZO, ZTO, or ITZO. Alternatively, the semiconductor material layer may be formed using polysilicon or amorphous silicon. For example, an amorphous silicon layer may be formed on the buffer layer 105. The amorphous silicon layer may be crystallized through a laser or a thermal treatment to be transformed into the semiconductor material layer.

A gate insulation layer 115 covering the active layer 110 may be formed on the buffer layer 105, and a gate electrode 120 may be formed on the gate insulation layer 115.

The gate insulation layer 115 may be formed using silicon oxide, silicon nitride, or silicon oxynitride. A first conductive layer may be formed on the gate insulation layer 115, and may be patterned by, e.g., a photolithography process, to form the gate electrode 120. The first conductive layer may be formed using a metal, an alloy, or a metal nitride. The first conductive layer may be formed to include a plurality of metal layers.

The gate electrode 120 may be superimposed over the active layer 110. In example embodiments, the gate electrode 120 may be formed simultaneously with a scan line S illustrated in FIG. 1. For example, the gate electrode 120 and the scan line S may be formed from the first conductive layer through the same etching process.

In an implementation, impurities may be implanted into the active layer 110 using the gate electrode 120 as an ion-implantation mask to form source and drain regions at both ends of the active layer 110. A portion of the active layer between the source and drain regions may be defined as a channel region. The channel region may substantially overlap the gate electrode 120.

An insulating interlayer 125 covering the gate electrode 120 may be formed on the gate insulation layer 115. A source electrode 130 and a drain electrode 135 may be formed through the insulating interlayer 125 and the gate insulation layer 115 to be in contact with the active layer 110.

For example, the insulating interlayer 125 and the gate insulation layer 115 may be partially etched to form contact holes through which the active layer 110 is partially exposed. A second conductive layer sufficiently filling the contact holes may be formed on the insulating interlayer 125 and the active layer 110. The second conductive layer may be patterned by, e.g., a photolithography process, to form the source electrode 130 and the drain electrode 135.

Accordingly, a transistor TR, e.g., a thin film transistor, may be defined by the active layer 110, the gate insulation layer 115, the gate electrode 120, the source electrode 130, and the drain electrode 135 on the pixel area PA. For example, the pixel area PA may include a plurality of pixels, and at least one transistor may be formed on each pixel.

The pixel circuit may include the transistor TR, a data line D, and a scan line S.

In an implementation, the source electrode 130 and the drain electrode 135 may contact the source region and the drain region, respectively. The source electrode 130 may be integral with the data line D illustrated in FIG. 1. In this case, the source electrode 130, the drain electrode 135, and the data line D may be formed from the second conductive layer by substantially the same etching process.

The insulating interlayer 125 may be formed using silicon oxide, silicon nitride, or silicon oxynitride. The second conductive layer may be formed using a metal, an alloy, or a metal nitride. The second conductive layer may be formed by stacking a plurality of metal layers.

A via insulation layer 140 may be formed on the insulating interlayer 125 to cover the source electrode 130 and the drain electrode 135.

In an implementation, the via insulation layer 140 may be formed using a transparent organic material, e.g., a polyimide-based resin, an epoxy-based resin, an acryl-based resin, polyester, etc. The via insulation layer 140 may have a sufficient thickness such that a top surface of the via insulation layer 140 may be substantially planar or level.

The above-mentioned buffer layer 105, the semiconductor material layer, the first and second conductive layers, the gate insulation layer 115, the insulating interlayer 125, and the via insulation layer 140 may be formed by at least one of a chemical vapor deposition (CVD) process, a plasma enhanced chemical vapor deposition (PECVD) process, a high density plasma-chemical vapor deposition (HDP-CVD) process, a thermal evaporation process, a vacuum evaporation process, a spin coating process, a sputtering process, an atomic layer deposition: (ALD) process, and a printing process.

Figure 10:
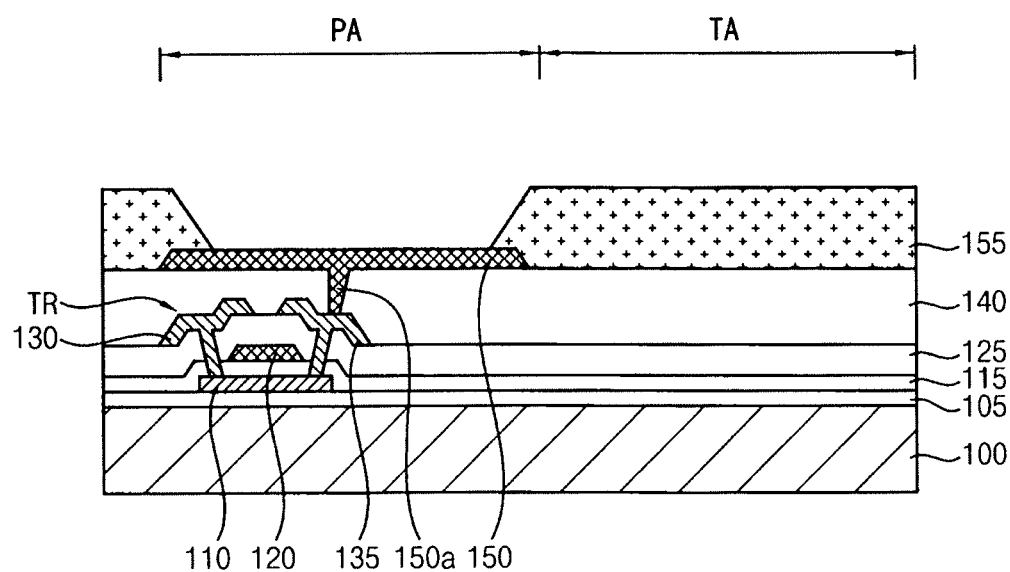

Referring to FIGS. 8 and 10, in operation S11, a first electrode 150 may be formed on the pixel area PA of the substrate 100. The first electrode 150 may be electrically connected to the transistor TR. For example, the first electrode 150 may be in contact with the drain electrode 135.

For example, the via insulation layer 140 may be partially etched to form a via hole through which the drain electrode 135 is exposed. A third conductive layer sufficiently filling the via hole may be formed on the via insulation layer 140, and then patterned to form the first electrode 150.

In an implementation, the third conductive layer may be formed using a metal such as Al, Ag, W, Cu, Ni, Cr, Mo, Ti, Pt, Ta, Nd, or Sc, or an alloy thereof, by a thermal evaporation process, a vacuum evaporation process, a sputtering process, an ALD process, a CVD process, a printing process, etc. In an implementation, the third conductive layer may be formed using a transparent conductive material, e.g., ITO, IZO, zinc oxide, or indium oxide.

As illustrated in FIG. 10, a portion of the first electrode 150 formed in the via hole may be defined as a via portion 150a. The first electrode 150 may be electrically connected to the transistor TR through the via portion 150a.

The first electrode 150 may be provided for the each pixel. In this case, a cross-sectional area from a top or plan view of the first electrode 150 may be substantially the same as an area of the each pixel.

A PDL 155 may be formed on the via insulation layer 140. The PDL 155 may cover a peripheral portion of the first electrode 150. For example, a photosensitive organic material including, e.g., a polyimide-based resin or an acryl-based resin, may be coated on the via insulation layer, and then exposure and developing processes may be performed to form the PDL 155.

Figure 11:
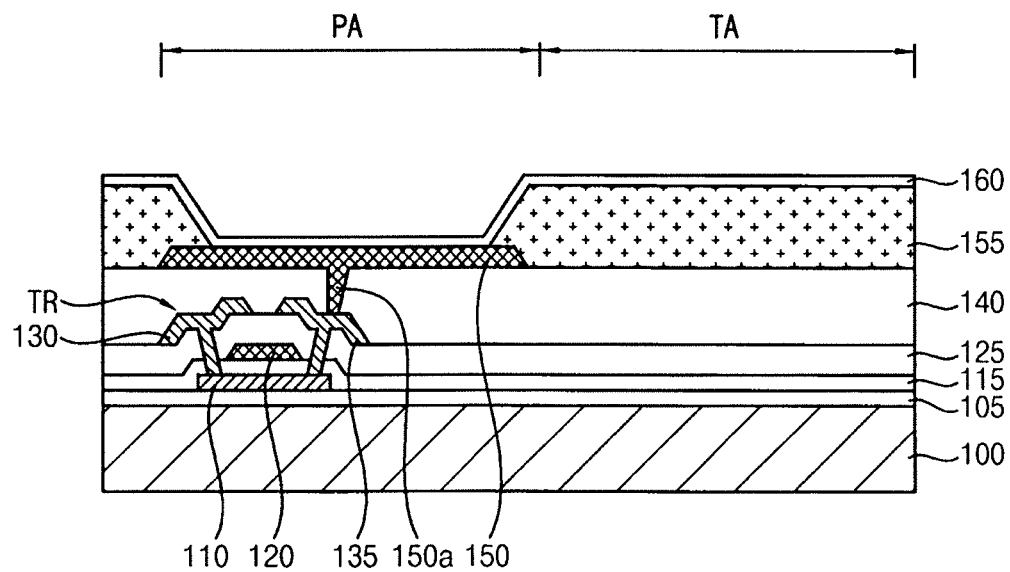

Referring to FIGS. 8 and 11, in operation S12, an HTL 160 may be formed on the pixel area PA and the transmission area TA of the substrate 100 using an open mask.

The open mask, as used herein, may mean a mask including an opening through which both the pixel area PA and the transmission area TA are commonly exposed.

In an implementation, the open mask may be located over the substrate 100 such that the PDL 155 and the first electrode 150 are exposed therethrough. The hole transport material as mentioned above may be provided through the open mask by, e.g., a spin coating process, a roll printing process, a nozzle printing process, or an inkjet printing process to form the HTL 160.

Accordingly, the HTL 160 may be formed continuously on both the PDL 155 and the first electrode 150.

Figure 12:
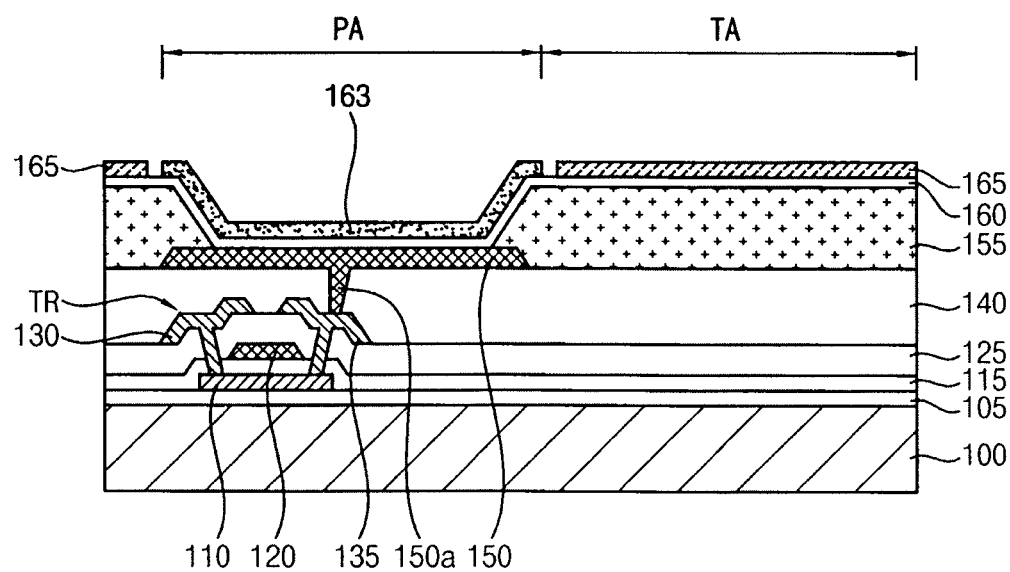

Referring to FIGS. 8 and 12, in operation S13, an emitting layer 163 and a TCL 165 may be formed on the HTL 160. The emitting layer 163 and the TCL 165 may be selectively formed on portions of the HTL 160 of the pixel area PA and the transmission area TA, respectively.

In an implementation, the emitting layer 163 and the TCL 165 may be formed individually using a separate first mask and second mask. In an implementation, the first and second masks may be a fine metal mask (FMM) including an opening of a fine pattern or a fine slit.

The first mask may include a plurality of first openings through which regions corresponding to a red pixel Pr, a green pixel Pg, and a blue pixel Pb are exposed. The first mask may be located over the substrate 100 such that the first openings are aligned with the pixel area PA. The above-mentioned light emitting material may be provided through the first mask by, e.g., a spin coating process, a roll printing process, a nozzle printing process, or an inkjet printing process, to form the emitting layer 163.

The second mask may include a second opening substantially overlapping the transmission area TA. The second mask may be located over the substrate 100 such that the second opening is aligned with the transmission area TA. A non-emitting material (different from the light emitting material) may be provided through the second mask by, e.g., a spin coating process, a roll printing process, a nozzle printing process, or an inkjet printing process, to form the TCL 165.

In an implementation, if the first mask and the second mask are placed to face each other, the first opening and the second opening may not overlap each other. For example, if the first and second masks are implemented in the same mask, the first and second masks, e.g., openings in the first mask and the second mask, may be spaced apart from each other in a top plan view. Thus, the TCL 165 and the emitting layer 163 may be also spaced apart from each other.

Figure 13:
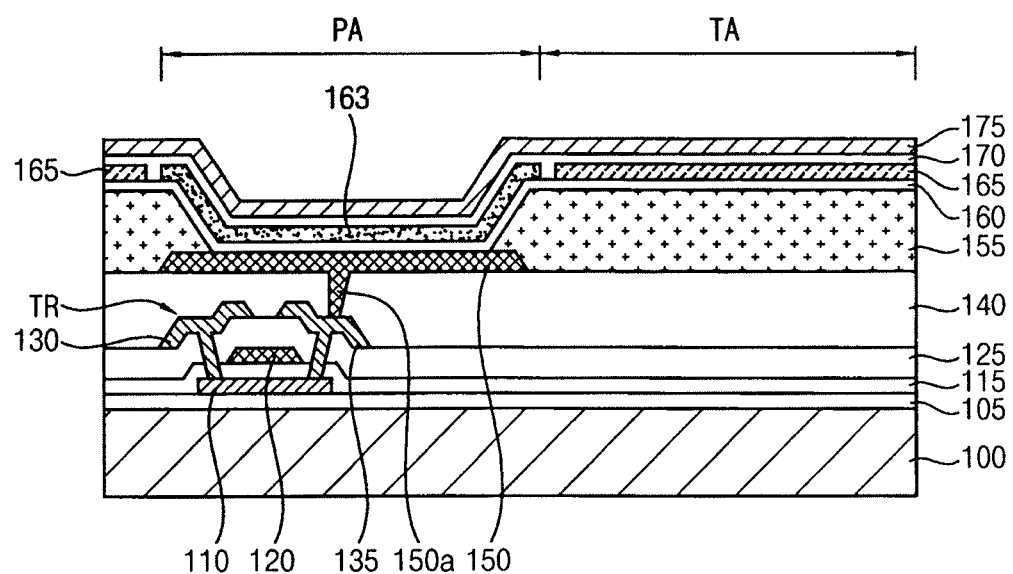

Referring to FIGS. 8 and 13, in operation S14, an ETL 170 and a second electrode 175 may be formed on the pixel area PA and the transmission area TA using the open mask.

The open mask may be substantially the same as that for the formation of the HTL 160. The open mask may include an opening through which the emitting layer 163 and the TCL 165 are commonly exposed.

In an implementation, the open mask may be located over the substrate 100. The above-mentioned electron transport material may be provided through the open mask by, e.g., a spin coating process, a roll printing process, a nozzle printing process, or an inkjet printing process, to form the ETL 170.

A metal having a low work function, Al, Ag, W, Cu, Ni, Cr, Mo, Ti, Pt, Ta, Nd, Sc, or an alloy thereof, may be deposited on the ETL 170 using the open mask to form the second electrode 175.

In an implementation, a capping layer 180 (see FIG. 2) may be formed commonly on the pixel area PA and the transmission area TA using the open mask. The capping layer 180 may be formed using a transparent organic material such as a polyimide-based resin, an epoxy-based resin, or an acryl-based resin. In an implementation, the capping layer 180 may be formed using an inorganic material such as silicon oxide, silicon nitride, or silicon oxynitride.

In an implementation, the capping layer may be formed as a multi-layered structure including a first capping layer and a second capping layer.

In an implementation, as illustrated in FIG. 4, a first capping layer 180a may be formed commonly on the pixel and transmission areas PA and TA using the open mask. A second capping layer 180b may be formed selectively on (e.g., only on) the transmission area TA using the second mask.

In an implementation, as illustrated in FIG. 5, a first capping layer 181a may be formed commonly on the pixel and transmission areas PA and TA using the open mask. A second capping layer 181b may be formed selectively on (e.g., only on) the pixel area PA using the first mask.

Figure 14:
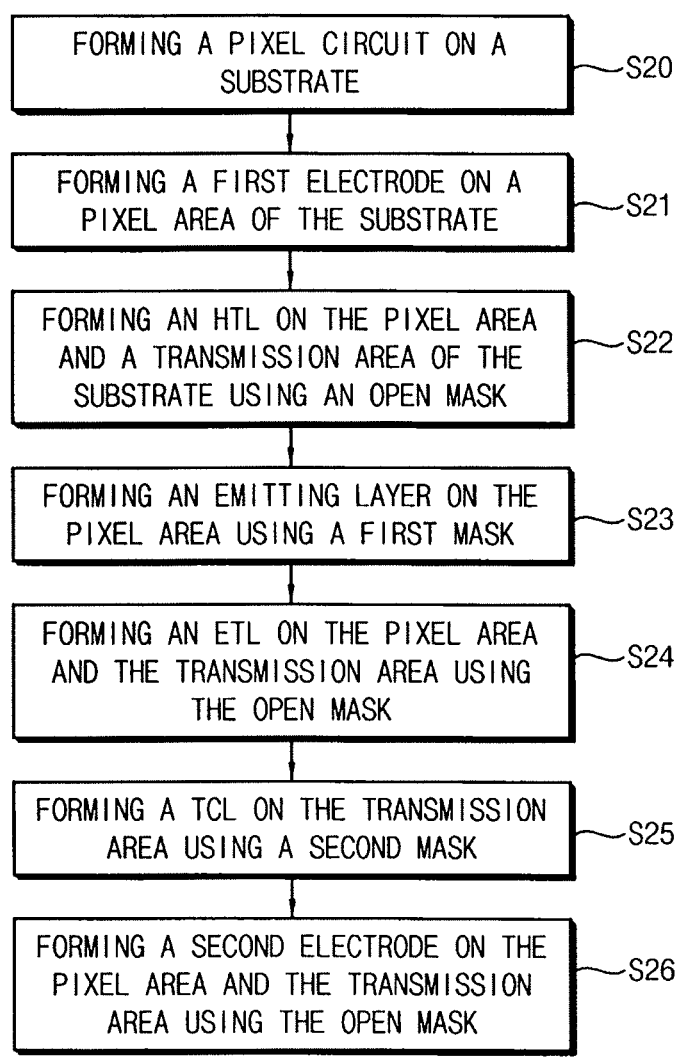
FIG. 14 illustrates a flow chart of a method of manufacturing an OLED device in accordance with some embodiments.
Figure 15:
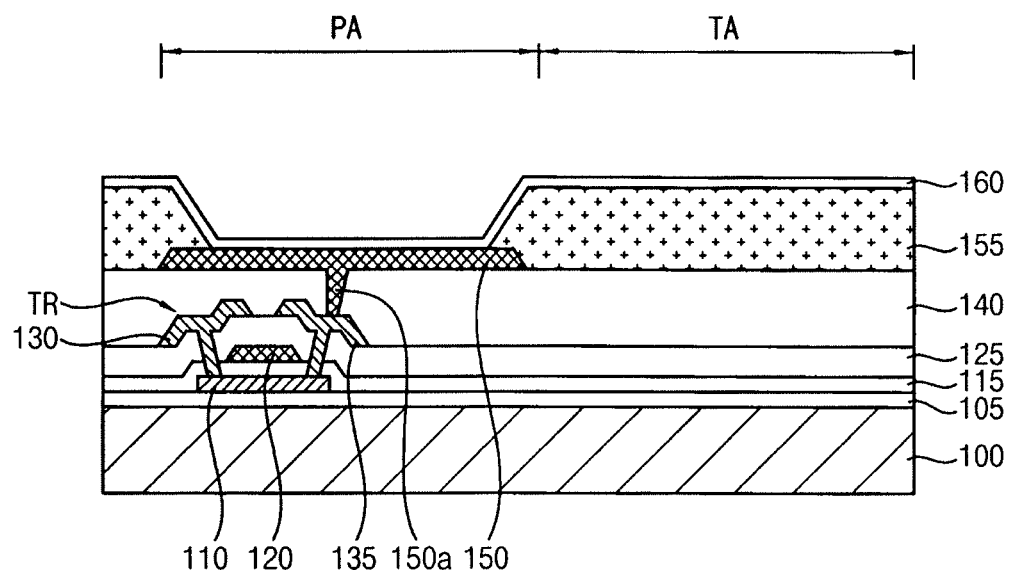
FIGS. 15 to 19 illustrate cross-sectional views of stages in a method of manufacturing an OLED device in accordance with some embodiments.

FIG. 14 illustrates a flow chart of a method of manufacturing an OLED device in accordance with some embodiments. FIGS. 15 to 19 illustrate cross-sectional views of stages in a method of manufacturing an OLED device in accordance with some embodiments. Repeated detailed descriptions of processes substantially the same as or similar to those illustrated with reference to FIGS. 8 to 13 may be omitted Referring to FIGS. 14 and 15, in operations S20 to S22, processes substantially the same as or similar to those illustrated with reference to FIGS. 9 to 11 may be performed. Accordingly, a pixel circuit may be formed on a substrate 100, and a first electrode 150 electrically connected to the pixel circuit may be formed on a pixel area PA of the substrate 100. An HTL 160 may be formed commonly on the pixel area PA and a transmission area TA using the above-mentioned open mask.

Figure 16:
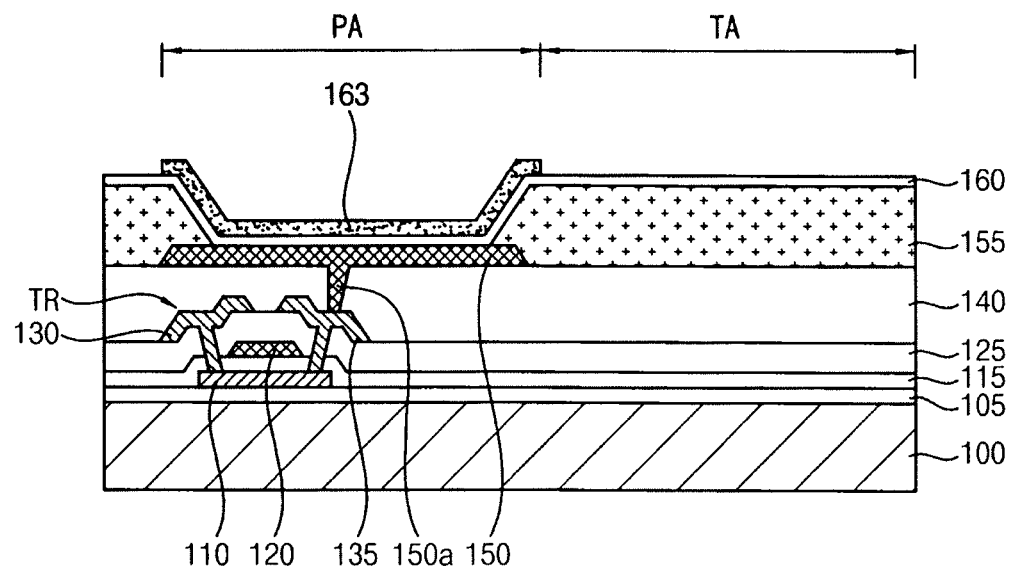

Referring to FIGS. 14 and 16, in operation S23, an emitting layer 163 may be formed on a portion of the HTL 160 of the pixel area PA using the first mask described with reference to FIG. 12.

Figure 17:
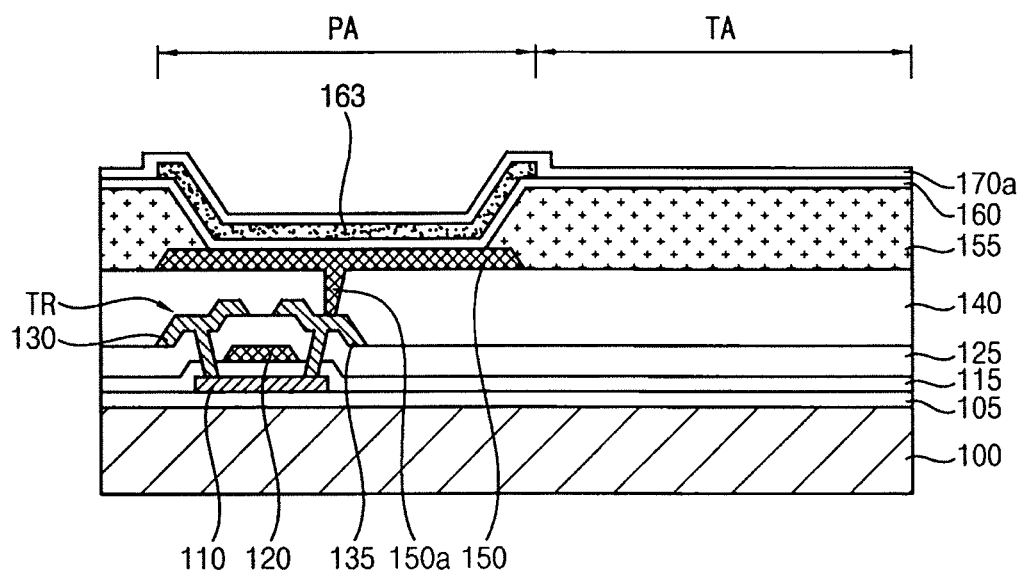

Referring to FIGS. 14 and 17, in operation S24, an ETL 170a may be formed commonly on the pixel area PA and the transmission area TA using the open mask. The ETL 170a may be formed conformably on the emitting layer 163 and the HTL 160.

Figure 18:
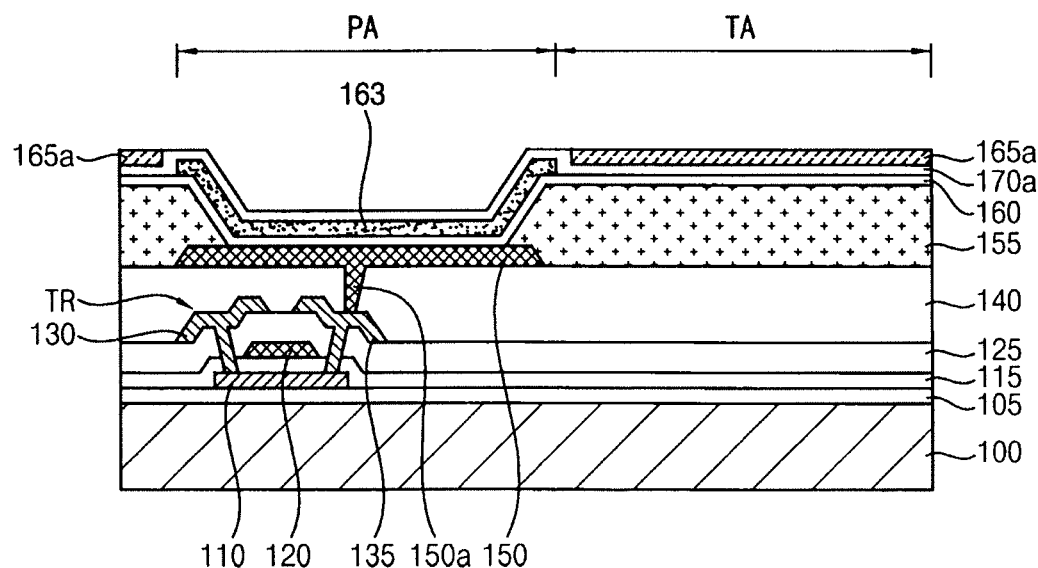

Referring to FIGS. 14 and 18, in operation S25, a TCL 165a may be formed selectively on (e.g., only on) the transmission area TA using the second mask described with reference to FIG. 12. The TCL 165a may be formed on the ETL 170a to be physically separated from the emitting layer 163.

Figure 19:
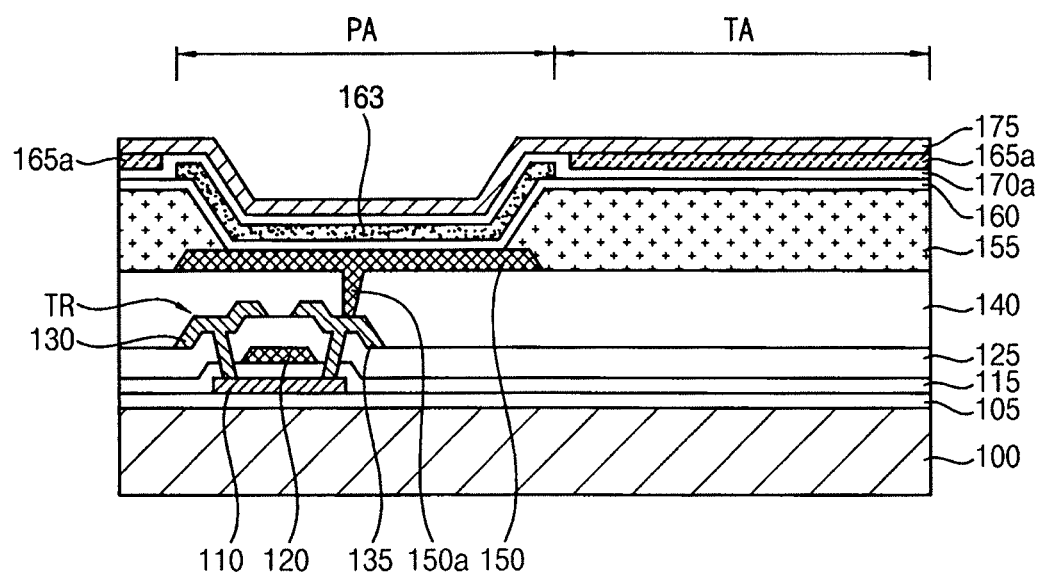

Referring to FIGS. 14 and 19, in operation S26, a second electrode 175 may be formed commonly on the pixel and transmission areas PA and TA using the open mask. The second electrode may be formed conformably on the ETL 170a and the TCL 165a.

A capping layer 180 may be further formed using the open mask to obtain the OLED device as illustrated in FIG. 3.

As described above, a first capping layer may be formed on the second electrode 170a and commonly on the pixel and transmission areas PA and TA using the open mask. A second capping layer may be formed selectively on (e.g., only on one of) the pixel area PA or the transmission area TA using the first mask or the second mask.

Figure 20:
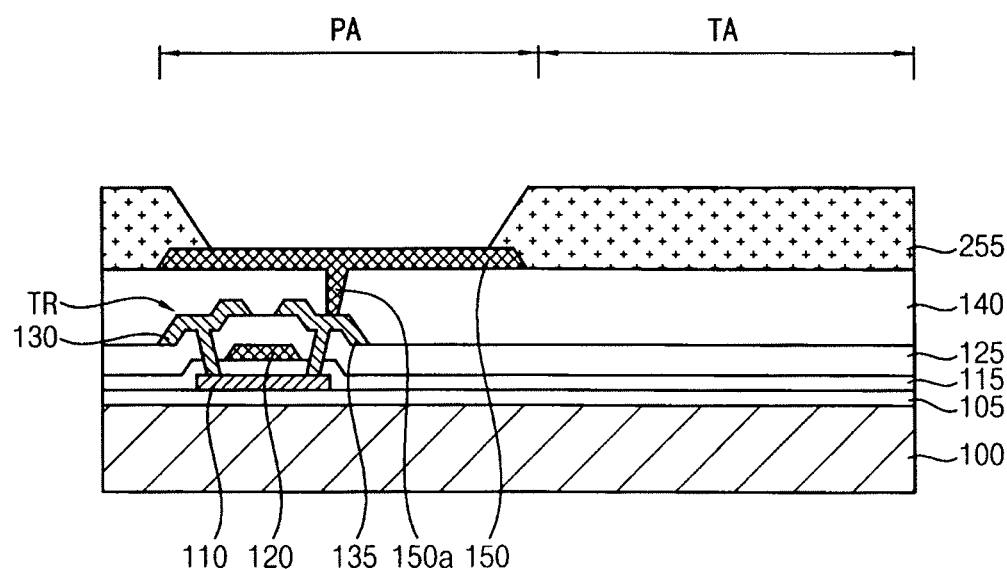
FIGS. 20, 21A, and 21B illustrate cross-sectional views of stages in a method of manufacturing an OLED device in accordance with some embodiments.
Figure 21A:
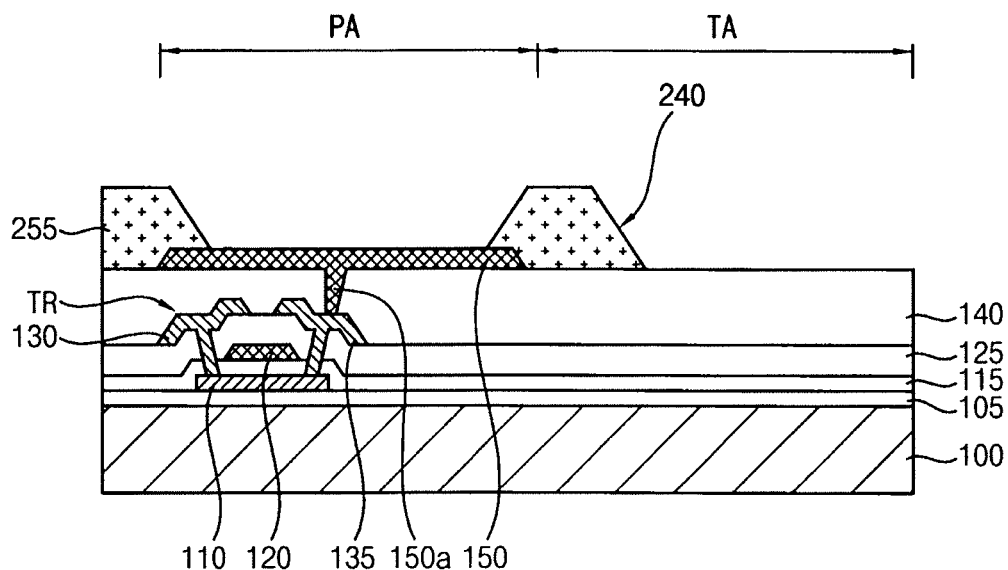
Figure 21B:
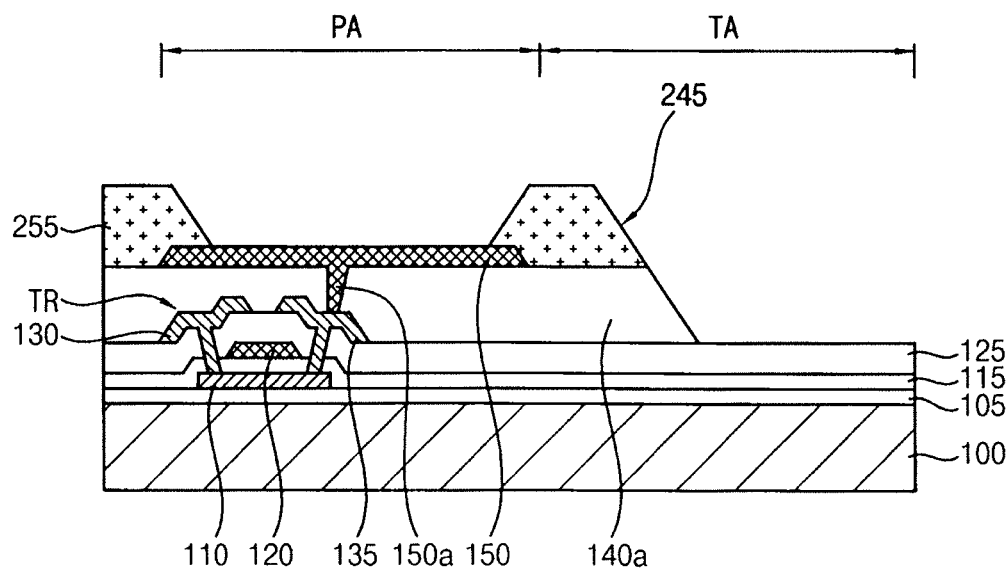

FIGS. 20, 21A, and 21B illustrate cross-sectional views of stages in a method of manufacturing an OLED device in accordance with some embodiments. Repeated detailed descriptions of processes substantially the same as or similar to those illustrated with reference to FIGS. 8 to 13, or FIGS. 14 to 19 may be omitted.

Referring to FIG. 20, processes substantially the same as or similar to those illustrated with reference to FIGS. 9 and 10 may be performed. Accordingly, a pixel circuit may be formed on a substrate 100, and a via insulation layer covering the pixel circuit may be formed.

A first electrode 150 (electrically connected to the pixel circuit) may be formed on a portion of the via insulation layer 140 of a pixel area PA. A PDL 255 (through which the first electrode 150 is at least partially exposed) may be formed on the via insulation layer 140. The PDL 255 may be formed using a black material, e.g., carbon black, phenylene black, aniline black, cyanine black, or nigrosine acid black by, e.g., a printing process.

Referring to FIG. 21A, a portion of the PDL 255 on a transmission area TA may be etched by, e.g., a dry etching process, to form a transmitting window. Thus, the PDL 255 may be transformed into a line pattern or a grid pattern including or outlining the transmitting window 240. In an implementation, a top surface of the via insulation layer 140 may be exposed through the transmitting window 240.

In an implementation, the above-mentioned second mask may be utilized as an etching mask in the etching process.

In an implementation, insulation layers under the PDL 255 may be further etched to expand the transmitting window.

For example, as illustrated in FIG. 21B, a portion of a via insulation layer 140a on the transmission area TA may be further etched using the PDL 255 as an additional mask. Accordingly, a transmitting window 245 defined by sidewalls of the PDL 255 and sidewalls of the via insulation layer 140a may be formed. In this case, a top surface of an insulating interlayer 125 may be exposed through the transmitting window 245. The sidewalls may be tapered with respect to a top surface of the substrate 100 due to a property of a dry etching process.

In an implementation, the insulating interlayer 125 may be also partially removed by the dry etching process. In this case, the transmitting window may extend through the insulating interlayer 125, and a top surface of the gate insulation layer 115 may be exposed through the transmitting window. In an implementation, the transmitting window may further extend through the gate insulation layer 115 such that a top surface of a buffer layer 105 may be exposed through the transmitting window.

Subsequently, processes substantially the same as or similar to those illustrated with reference to FIGS. 11 to 13 may be performed.

In an implementation, e.g., as illustrated in FIG. 21A, an HTL 260 may be formed conformably on surfaces of the PDL 255 and the first electrode 150, and on the sidewall and a bottom of the transmitting window 240. An emitting layer 263 and a TCL 265 may be formed on portions of the HTL 260 of the pixel area PA and transmission area TA, respectively. An ETL 270, a second electrode 275 and a capping layer 280 may be sequentially formed commonly on the pixel area PA and the transmission area TA to obtain the OLED device of FIG. 6.

In an implementation, as illustrated in FIG. 21B, an HTL 260a may be formed conformably on surfaces of the PDL 255 and the first electrode 150, and on the sidewall and a bottom of the transmitting window 245. An emitting layer 263a and a TCL 265a may be formed on portions of the HTL 260a of the pixel area PA and transmission area TA, respectively. An ETL 270a, a second electrode 275a and a capping layer 280a may be sequentially and commonly formed on the pixel area PA and the transmission area TA to obtain the OLED device of FIG. 7.

According to an embodiment, the number of layers stacked on the transmission area TA may be reduced by the formation of the transmitting window 240 and 245. Thus, a transmittance of the transmission area TA may be further improved, relative to that of the pixel area PA.

By way of summation and review, an OLED device having transparent or transmitting properties has been considered. To provide the transparent or transmitting properties, the OLED device may include a transparent region. For example, an electrode included in the transparent region may be very thin. However, a reduction of the thickness of the electrode may be limited in a patterning process, and may deteriorate emission characteristics of the OLED device in an emission region.

According to an embodiment, a transmittance control layer (that is different from an emitting layer) may be formed selectively on (e.g., only on) a transmission area of an OLED device. Other organic layers (except for the transmittance control layer) may be formed continuously and commonly on a pixel area and the transmission area. Thus, a manufacturing process of the OLED device may be simplified. Further, a transmittance optimized structure may be realized in the transmission area without disturbing a resonance structure and a light emitting structure in the pixel area.

The embodiments may provide an organic light emitting display device having an improved transparent property.

The embodiments may provide a method of manufacturing an organic light emitting display device having an improved transparent property.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display (OLED) device, comprising:
   a substrate, the substrate including a pixel area as a display area for displaying an image and a transmission area as a non-display area through which external light is transmitted;
   a pixel circuit on the pixel area of the substrate, the pixel circuit including a transistor;
   a first electrode on the pixel area of the substrate, the first electrode being electrically connected to the pixel circuit;
   a pixel defining layer through which the first electrode is exposed;
   a first organic layer extending continuously on the pixel area and the transmission area of the substrate and covering the first electrode and the pixel defining layer;
   a light emitting layer selectively on a portion of the first organic layer on the pixel area;
   a second organic layer extending continuously on the pixel area and the transmission area of the substrate and covering the light emitting layer;
   a third organic layer selectively on the transmission area, the third organic layer as a non-light emitting layer having a different transmittance from that of the light emitting layer; and
   a second electrode extending continuously on the pixel area and the transmission area of the substrate and covering the second organic layer and the third organic layer,
   wherein the light emitting layer and the third organic layer do not vertically overlap.

2. The OLED device as claimed in claim 1, wherein the third organic layer includes at least one of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, and 2-(4-(9,10-di(naphthalen-2-yl)anthracen-2-yl)phenyl)-1-phenyl-1H-benzo-[D]imidazole.

3. The OLED device as claimed in claim 1, wherein:
   the first organic layer includes a hole transport material, and
   the second organic layer includes an electron transport material.

4. The OLED device as claimed in claim 1, wherein the third organic layer is between the first organic layer and the second organic layer.

5. The OLED device as claimed in claim 1, wherein the third organic layer is between the second organic layer and the second electrode.

6. The OLED device as claimed in claim 1, wherein the light emitting layer and the third organic layer are spaced apart from each other at an interface between the pixel area and the transmission area.

7. The OLED device as claimed in claim 1, further comprising a capping layer on the second electrode.

8. The OLED device as claimed in claim 7, wherein the capping layer includes:
   a first capping layer extending continuously on the pixel area and the transmission area; and
   a second capping layer on the first capping layer, the second capping layer being selectively disposed on either the pixel area or the transmission area.

9. The OLED device as claimed in claim 1, further comprising a via insulation layer covering the pixel circuit, wherein the pixel defining layer is disposed on the via insulation layer, and the first electrode extends through the via insulation layer to be electrically connected to the pixel circuit,
   wherein the third organic layer is disposed on the pixel defining layer.

10. The OLED device as claimed in claim 9, wherein:
    the transmission area is at least partially exposed by the pixel defining layer, and
    a transmitting window is defined by a sidewall of the pixel defining layer.

11. The OLED device as claimed in claim 10, wherein the pixel defining layer includes a black material.

12. The OLED device as claimed in claim 11, wherein the black material includes at least one of carbon black, phenylene black, aniline black, cyanine black, and nigrosine acid black.

13. The OLED device as claimed in claim 10, wherein:
    a top surface of the via insulation layer is exposed by the transmitting window, and
    the first organic layer extends continuously on surfaces of the pixel defining layer and the first electrode, and on the top surface of the via insulation layer.

14. The OLED device as claimed in claim 10, wherein the transmitting window is defined by the sidewall of the pixel defining layer and a sidewall of the via insulation layer.

15. The OLED device as claimed in claim 14, further comprising an insulating interlayer under the via insulation layer, the insulating interlayer partially covering the pixel circuit,
    wherein the first organic layer extends continuously on surfaces of the pixel defining layer and the first electrode, the sidewall of the via insulation layer, and a top surface of the insulating interlayer.

16. An organic light emitting display (OLED) device, comprising:
    a substrate, the substrate including a pixel area as a display area for displaying an image and a transmission area as a non-display area for transmitting external light;
    a first electrode on the pixel area of the substrate;
    a pixel defining layer through which the first electrode is exposed;
    a common organic layer including first and second organic layers, the first organic layer extending continuously on the pixel area and the transmission area and covering the first electrode and the pixel defining layer, the second organic layer extending continuously on the pixel area and the transmission area of the substrate and covering the light emitting layer;
    a light emitting layer selectively on the pixel area and not on the transmission area;
    a non-pixel organic layer selectively on the transmission area, the non-pixel organic layer being a non-light emitting layer; and
    a second electrode extending continuously on the pixel area and the transmission area, the second electrode facing the first electrode with respect to the common organic layer,
    wherein the light emitting layer and the non-pixel organic layer do not vertically overlap.

17. The OLED device as claimed in claim 16, wherein the non-pixel organic layer has a transmittance that is higher than that of the light emitting layer.

18. The OLED device as claimed in claim 16, wherein the non-pixel organic layer is on the common organic layer and in contact with the second electrode.

19. The OLED device of claim 16, wherein the first organic layer is between the first electrode and the light emitting layer,
wherein the second organic layer is between the light emitting layer and the second electrode, and
wherein the non-pixel organic layer is interposed between the first organic layer and the second organic layer.

20. The OLED device as claimed in claim 19, wherein:
the first organic layer includes a hole transport material, and
the second organic layer includes an electron transport material.

21. An organic light emitting display (OLED) device, comprising:
a substrate, the substrate including a pixel area as a display area for displaying an image and a transmission area, as a non-display area for transmitting external light;
a pixel circuit on the pixel area of the substrate, the pixel circuit including a transistor;
a first electrode on the pixel area of the substrate, the first electrode being electrically connected to the pixel circuit;
a pixel defining layer through which the first electrode is exposed;
a hole transport layer extending continuously on the pixel area and the transmission area of the substrate and covering the first electrode and the pixel defining layer;
a light emitting layer selectively on a portion of the hole transport layer on the pixel area;
an electron transport layer extending continuously on the pixel area and the transmission area of the substrate and covering the light emitting layer;
a transmittance control layer on a portion of the hole transport layer on the transmission area, the transmittance control layer being a non-light emitting layer; and
a second electrode extending continuously on the pixel area and the transmission area of the substrate, the second electrode covering the light emitting layer and the transmittance control layer,
wherein the light emitting layer and the transmittance control layer do not vertically overlap.

22. The OLED device of claim 21, wherein the electron transport layer is between the light emitting layer and the second electrode.

23. The OLED device as claimed in claim 1, wherein:
the transistor of the pixel circuit and the transmission area do not vertically overlap, and
the first electrode vertically overlaps the light emitting layer, and does not vertically overlap the third organic layer.

24. The OLED device as claimed in claim 1, wherein:
the light emitting layer is for optimizing a light emitting efficiency of the OLED device, and
the third organic layer is for optimizing a transmittance of the OLED device.

25. The OLED device as claimed in claim 1, wherein:
the second organic layer is formed of a same material, and the third organic layer is formed only on the transmission area.

26. A method of manufacturing an organic light emitting display device, the method comprising:
preparing a substrate that includes a pixel area as a display area for displaying an image and a transmission area as a non-display area for transmitting external light;
forming a pixel circuit on the pixel area of the substrate;
forming a first electrode that is electrically connected to the pixel circuit on the pixel area of the substrate;
forming a hole transport layer on the pixel area and the transmission area using an open mask such that the hole transport layer covers the first electrode;
forming a light emitting layer on the hole transport layer using a first mask, the first mask including a first opening through which the pixel area is selectively exposed;
forming an electron transport layer on the pixel area and the transmission area of the substrate;
forming a transmittance control layer as a non-light emitting layer on the hole transport layer using a second mask, the second mask including a second opening through which the transmission area is selectively exposed; and
forming a second electrode continuously on the light emitting layer and the transmittance control layer using the open mask,
wherein the electron transport layer extends continuously on the pixel area and the transmission area of the substrate and covers the light emitting layer, and
wherein the light emitting layer and the transmittance control layer do not vertically overlap.

27. The method as claimed in claim 26, wherein the transmittance control layer includes a non-emitting material that is different from a material included in the light emitting layer.

28. The method of claim 26, wherein the electron transport layer is formed between the emitting layer and the second electrode using the open mask.

29. The method as claimed in claim 26, further comprising forming a first capping layer on the second electrode using the open mask.

30. The method as claimed in claim 29, further comprising forming a second capping layer on the first capping layer using the first mask or the second mask such that the second capping layer is selectively formed on either of the pixel area or the transmission area.

31. The method as claimed in claim 26, further comprising:
forming a via insulation layer that covers the pixel circuit;
forming a pixel defining layer on the via insulation layer such that the first electrode is exposed through the pixel defining layer; and
removing a portion of the pixel defining layer on the transmission area to form a transmitting window,
wherein the second mask is used as an etching mask in the removing the portion of the pixel defining layer.

* * * * *